United States Patent
Masgonty et al.

(10) Patent No.: US 6,366,504 B1
(45) Date of Patent: Apr. 2, 2002

(54) RANDOM ACCESS MEMORY

(75) Inventors: Jean-Marc Masgonty, Marin; Stefan Cserveny, Epalinges; Christian Piguet, Neuchatel; Frédéric Robin, Geneveys, all of (CH)

(73) Assignee: CSEM Centre Suisse d'Electronique et de Microtechnique SA, Neuchatel (CH)

( * ) Notice: Subject to any disclaimer, the term of this patent is extended or adjusted under 35 U.S.C. 154(b) by 0 days.

(21) Appl. No.: 09/612,061

(22) Filed: Jul. 7, 2000

(30) Foreign Application Priority Data

Jul. 9, 1999 (FR) .............................. 99 08947

(51) Int. Cl.⁷ .............................................. G11C 16/04
(52) U.S. Cl. ................... 365/189.08; 365/154; 365/190
(58) Field of Search ........................... 365/230.06, 154, 365/203, 156, 189.08, 190, 49

(56) References Cited

U.S. PATENT DOCUMENTS

| | | | |
|---|---|---|---|
| 5,729,501 A | 3/1998 | Phillips et al. | 365/230.03 |
| 5,850,367 A | 12/1998 | Wada et al. | 365/230.03 |
| 5,901,079 A | 5/1999 | Chiu et al. | 365/154 |
| 6,212,094 B1 * | 4/2001 | Rimondi | 365/156 |
| 6,240,009 B1 * | 5/2001 | Naffziger et al. | 365/154 |

OTHER PUBLICATIONS

"0.5μm 2M–Transistor BiPNMOS Channelless Gate Array", Hara et al., IEEE Journal of Solid–Stae Circuits 26 (1991 (Nov. ), No. 11, New York.

* cited by examiner

Primary Examiner—Richard Elms
Assistant Examiner—Hien Nguyen

(57) ABSTRACT

A random access memory comprises a matrix made up of cells arranged in rows and columns and the cells are addressed row by row. Each cell of a row is connected to first and second bit lines and at least the first bit line is subdivided into a plurality of sections connected to respective inputs of an output logic gate. The memory includes read/write control circuits which apply the following logic functions to each of the first and second bit lines directly or indirectly and selectively, according to whether a required operation is a write or a read. Sel.((W.D) or W̄)) is applied to the first bit line, whilst Sel.W.D is applied to both the first and second bits lines, where "Sel" is a cell selection signal representative of the address, "W" is a write command, W̄ is a read command, "D" is the data to be written into the addressed cell and "." indicates the AND function.

6 Claims, 2 Drawing Sheets

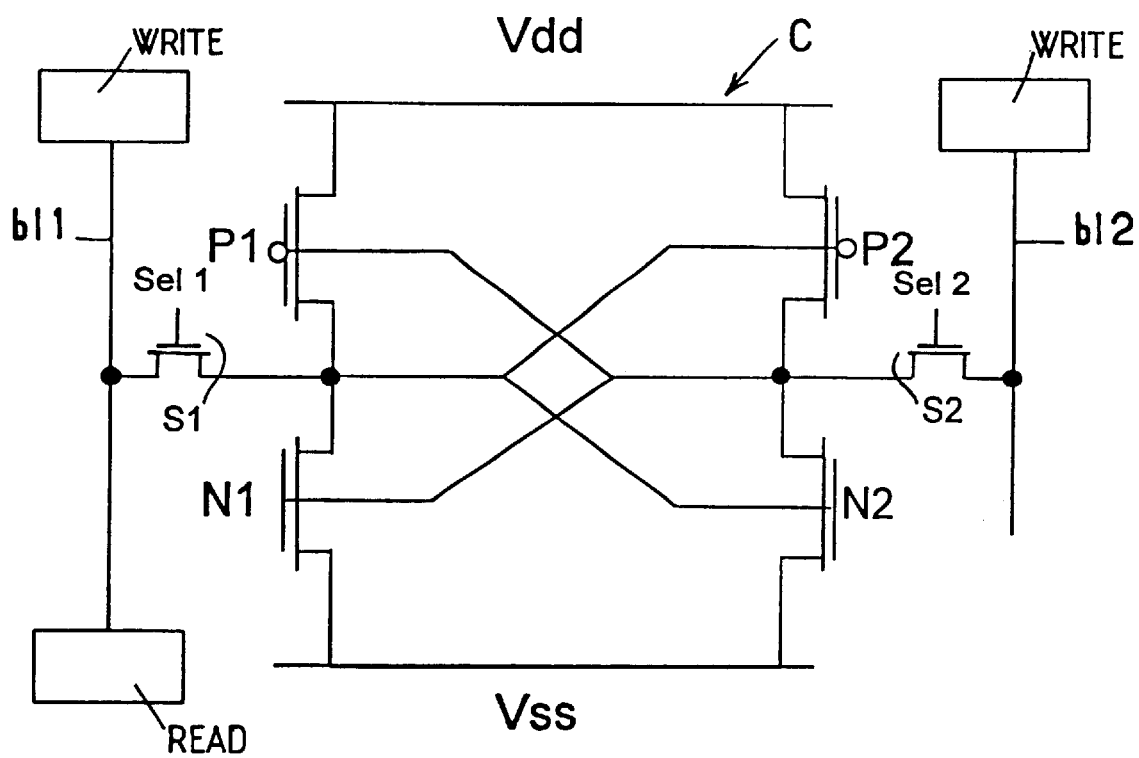
FIG.:1

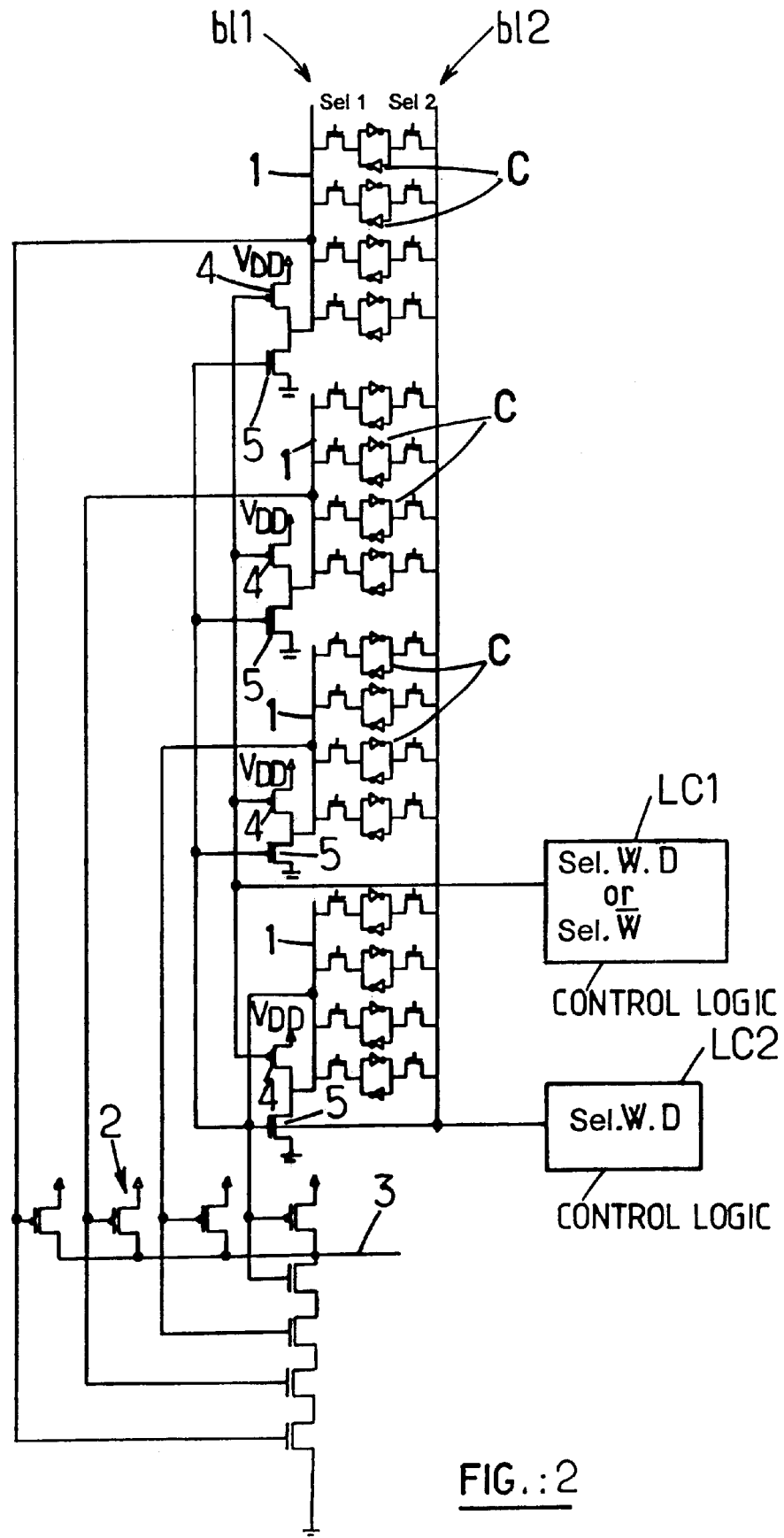
FIG.:2

RANDOM ACCESS MEMORY

BACKGROUND OF THE INVENTION

1. Field of the invention

The present invention relates to static random access memories (SRAM).

2. Description of the Prior art

A static random access memory comprises a matrix formed of columns and rows of memory cells. The rows of cells can be addressed by an address decoder. Each column is read/written using a direct bit line and an inverted bit line.

To perform a read cycle in SRAM the bit lines must be at a predetermined logic level, in other words they must be either charged or discharged, as appropriate. As their inherent capacitance is high, charging or discharging them takes some time and the duration of a read cycle is therefore long. Also, the power consumption of the memory is relatively high.

To reduce these drawbacks it is already known in the art to divide at least one of the bit lines into a plurality of sections connected to respective inputs of an output logic gate. See U.S. Pat. No. 5,729,501, for example.

In this way it is possible to reduce the capacitance of the bit lines and thereby save power on each write or read operation.

The object of the invention is to improve on prior art memories by proposing a memory with even lower power consumption and with more favorable transistor dimensions.

SUMMARY OF THE INVENTION

The invention therefore provides a random access memory comprising a matrix made up of cells arranged in rows and columns and in which the cells are adapted to be addressed row by row, each cell of a row is connected to first and second bit lines, and at least the first bit line is subdivided into a plurality of sections connected to respective inputs of an output logic gate, which memory includes read/write control means adapted to apply the following logic functions to each of the first and second bit lines directly or indirectly and selectively, according to whether a required operation is a write or a read.

Sel.((W.D) or $\overline{W}$)) is applied to the first bit line, whilst Sel.W.D is applied to both the first and second bits lines, where "Sel" is a cell selection signal representative of the address, "W" is the write command, $\overline{W}$ is a read command, "D" is the data to be written into the addressed cell and "." indicates the AND function.

Other features and advantages of the invention will become apparent in the course of the following description, which is given by way of example only and with reference to the accompanying drawings.

BRIEF DESCRIPTION OF THE DRAWINGS

FIG. 1 is a schematic of one cell of a random access memory according to the invention.

FIG. 2 is a schematic of parts of a preferred embodiment of a random access memory according to the invention.

DETAILED DESCRIPTION OF THE PREFERRED EMBODIMENT

FIG. 1 shows one example of a cell C for a random access memory RAM. It is formed by two switches connected in parallel and each comprising an n-type transistor and a p-type transistor in series. The power supply potentials $V_{dd}$ and $V_{ss}$ are applied to the terminals of the parallel circuit.

To be more precise, as shown in FIG. 1, the respective branches of the cell comprise a p-type transistor P1, P2 in series with an n-type transistor N1, N2 and the gates of the transistors are cross-connected.

The cell C also includes selector transistors S1 and S2 for connecting the branches of the cell to respective bit lines aligned with the columns of the memory matrix and referred to as a "direct bit line" (bl1) and an "inverted bit line" (bl2). In a manner that is known in the art, and which is common to all the cells of a row of the memory, the transistors S1 and S2 are controlled by selection signals Sel1 and Sel2 produced by the memory addressing system.

Data is read out of and written into the cells via the bit lines bl1 and bl2 by read control means READ and write control means WRITE, symbolized as rectangles in FIG. 1. In accordance with the invention the bit line bl1 is connected to the read and write control means and the bit line bl2 is connected only to the write control means.

FIG. 2 shows a preferred embodiment of a memory according to the invention in more detail, and to be more precise shows the organization of a single column of the random access memory, which is formed of a large number of cells C. To simplify the figure, the cells C are symbolized by two switches connected in antiparallel and only a few cells are shown. The memory can include a very large number of juxtaposed columns of this kind.

The cells C are connected to the direct and inverted bit lines bl1 and bl2. In this embodiment of the invention the bit line bl1 is divided into a plurality of line sections 1. Each line section 1 is connected to a group of cells C, all of which are connected to the other bit line bl2, which is not divided in this example. Although this cannot be seen in the figure, the division into sections is effected by means of groups of equivalent cells situated in the same rows of the memory matrix.

According to one essential feature of the invention, the memory cells are not symmetrical. Each addressed cell is written by the two selector transistors S1 and S2 but is read by only one of the transistors S1 or S2, according to the logic convention adopted for the memory.

The principle of this feature of the invention is shown in FIG. 1, which shows that, for one particular logic convention, the selector transistor S1 is activated in write mode and in read mode but the transistor S2 is activated only in write mode.

This method of controlling a cell has several advantages. Firstly, because each cell is written from both sides, it can be read at a low voltage $V_{DD}$. Secondly, because each cell is read from only one side, power consumption is reduced because of the lower capacitance. Finally, it is no longer necessary for the cell to be symmetrical, the transistors can have minimum dimensions and the transistor S1 can have dimensions chosen independently of those of the other transistors of the cell to suit the required speed of operation. Because the transistor S2 is small, the capacitance on the inverted bit line is low during writing, which further reduces power consumption. The size of the transistor S1 can be increased for a given size of the transistor N1. This increases the reading speed and an optimum ratio of the sizes can be close to 1 or even equal to 1.

In one embodiment of the invention $T_{N2}=T_{N1}/3.2$, $T_{S1}=T_{N1}$ and $T_{S2}=T_{N2}=T_{N1}/3.2$.

The sections 1 of the bit line bl1 are connected to the inputs of an output gate 2 producing the read signals at its output 3. The logic function of this gate is advantageously the NAND function, given the logic convention chosen for this memory, but a different function can of course be chosen if a different logic convention is adopted.

Each section 1 of the subdivided bit line bl1 is also connected to a p-type transistor 4 for precharging it and to a n-type control transistor 5.

The gates of the transistors 4 are connected together to first control logic LC1 implementing the function Sel.W.D or Sel.$\overline{W}$, according to whether the operation performed is a write or a read, where "Sel" is the selection signal, "W" is the write signal, $\overline{W}$ is the read signal, "D" is the data signal and the symbol "." represents the logic function "AND".

The gates of the transistors 5 are connected together to second control logic LC2 implementing the logic function Sel.W.D, whether the operation is a write or a read.

In this memory, the sections 1 of the bit line bl1 are always precharged to $V_{DD}$ when no cell of the column is addressed and the p-type transistor 4 is conducting with its gate at the voltage $V_{SS}$. This is therefore a waiting state for each column of the memory.

If a cell of a column is selected, the signal Sel goes high. If the operation is a write, the signal W goes high and the transistor 4 of the section 1 relating to the addressed cell applies the potential $V_{DD}$ to the section 1 if the data signal D is low. On the other hand, if the data signal D is high, the transistor 5 applies the potential $V_{SS}$ to the section 1. The corresponding bit line receives the complemented data signal D.

The waiting state of the bit line bl2 is the low level state. This line goes high only if a data signal is high while writing a cell of the column concerned. It is connected to a cell addressed by the selector transistor S2 only during writing. The transistor is not activated during reading, which reduces power consumption.

Note that controlling writing and reading as described can also be applied to random access memories in which neither bit line is divided in each column, in which case the memory can have asymmetrical cells with dimension ratios as described above.

The invention is not limited to the logic conventions described.

What is claimed is:

1. A random access memory comprising a matrix made up of cells arranged in rows and in columns and in which said cells are addressable row by row; first and second bit lines connected to each cell of a row, at least said first bit line being subdivided into a plurality of sections connected to respective inputs of an output logic gate; read/write control means for selectively applying logic functions to each of said first and second bit lines according to whether a required operation is a write or read; said logic functions including Sel. ((W.D.) or $\overline{W}$)) being applied to the first bit line, whilst Sel.W.D. is applied to both the first and second bits lines, where "Sel" is a cell selection signal representative of the address, "W" is a write command, "$\overline{W}$" is a read command, "D" is the data to be written into the addressed cell, and "." indicates the AND function.

2. The memory claimed in claim 1 wherein each section is connected to two transistors of opposite conductivity type and said logic functions are selectively applied to gates of said transistors.

3. The memory claimed in claim 1 wherein each cell has two branches each made up of two transistors of opposite conductivity type in series with their gates cross-connected and includes respective selector transistors connected to said branches and said bit lines to enable selection of said cell on addressing said memory, and said transistors of each branch which are connected to the corresponding bit line section are larger than said transistors of the other branch.

4. The memory claimed in claim 1 wherein each section is connected to precharging means.

5. The memory claimed in claim 1 wherein said output logic gate is a NAND gate.

6. The memory of claim 1 wherein said logic functions are applied indirectly to said first or second bit lines.

* * * * *